United States Patent
Gonzalez et al.

(10) Patent No.: US 10,424,680 B2
(45) Date of Patent: Sep. 24, 2019

(54) SYSTEM FOR TARGETED ANNEALING OF PV CELLS

(71) Applicant: SolarCity Corporation, San Mateo, CA (US)

(72) Inventors: Pablo Gonzalez, Fremont, CA (US); Rey Ilagan, San Jose, CA (US)

(73) Assignee: SolarCity Corporation, San Mateo, CA (US)

( * ) Notice: Subject to any disclaimer, the term of this patent is extended or adjusted under 35 U.S.C. 154(b) by 502 days.

(21) Appl. No.: 14/977,523

(22) Filed: Dec. 21, 2015

(65) Prior Publication Data

US 2017/0170348 A1 Jun. 15, 2017

Related U.S. Application Data

(60) Provisional application No. 62/267,220, filed on Dec. 14, 2015.

(51) Int. Cl.
*H01L 31/0463* (2014.01)

(52) U.S. Cl.
CPC ............... *H01L 31/0463* (2014.12)

(58) Field of Classification Search
None
See application file for complete search history.

(56) References Cited

U.S. PATENT DOCUMENTS

| | | | | |
|---|---|---|---|---|
| 4,338,362 A * | 7/1982 | Turcotte | ................. | C03C 17/22 136/260 |
| 4,364,508 A | 12/1982 | Lazzery et al. | | |
| 4,972,065 A * | 11/1990 | Ohlsen | ................. | A45D 20/12 34/97 |
| 5,328,520 A * | 7/1994 | Itagaki | ................. | H01L 21/288 136/256 |
| 5,389,159 A * | 2/1995 | Kataoka | ............. | H01L 31/0392 136/251 |
| 5,411,897 A * | 5/1995 | Harvey | ................. | B23K 1/20 136/256 |
| 5,913,991 A * | 6/1999 | Kubota | ................. | B29C 65/78 156/159 |
| 6,203,621 B1 | 3/2001 | Tran et al. | | |

(Continued)

FOREIGN PATENT DOCUMENTS

| | | |
|---|---|---|
| DE | 102011081674 A1 | 2/2013 |
| DE | 102013104384 A1 | 11/2013 |

(Continued)

*Primary Examiner* — Ibrahime A Abraham
*Assistant Examiner* — Gyounghyun Bae
(74) *Attorney, Agent, or Firm* — Kilpatrick Townsend & Stockton LLP

(57) ABSTRACT

A targeted-annealing system can automatically cure a conductive paste that may bind cascaded strips of a string together without damaging the strips. The targeted-annealing system can process strings of cascaded strips on a supporting surface, and can anneal conductive paste between overlapping strips by blowing heated air on the overlapping sections of the strips. An air nozzle shaped to target the overlapping sections may provide the heated air. The supporting surface may include a porous material that allows a vacuum to pull on the cascaded strips from below the surface during the annealing process.

7 Claims, 7 Drawing Sheets

(56) References Cited

U.S. PATENT DOCUMENTS

| | | | |
|---|---|---|---|
| 6,391,743 B1* | 5/2002 | Iwane | H01L 21/67092 136/243 |
| 6,395,972 B1 | 5/2002 | Tran et al. | |
| 8,220,685 B1 | 7/2012 | Lindsey et al. | |
| 9,029,689 B2 | 5/2015 | Phu et al. | |
| 9,065,008 B2* | 6/2015 | Degroot | H01L 31/188 |
| 2007/0012349 A1* | 1/2007 | Gaudiana | G06Q 30/00 136/244 |
| 2008/0196757 A1* | 8/2008 | Yoshimine | H01L 31/022425 136/244 |
| 2009/0056784 A1* | 3/2009 | Reinisch | H01L 31/05 136/244 |
| 2010/0043860 A1* | 2/2010 | Morita | H01L 31/188 136/244 |
| 2010/0275969 A1* | 11/2010 | Chan | H01L 31/0504 136/244 |
| 2012/0305072 A1* | 12/2012 | Fujimori | H01L 31/022441 136/256 |
| 2013/0164863 A1* | 6/2013 | Miyake | B21C 47/20 438/6 |
| 2013/0237000 A1* | 9/2013 | Tabe | H01L 31/18 438/57 |
| 2014/0373892 A1 | 12/2014 | Bergmann et al. | |
| 2015/0060434 A1 | 3/2015 | Sahoda et al. | |
| 2015/0255633 A1 | 9/2015 | Sukata | |
| 2015/0287875 A1* | 10/2015 | Phu | H01L 31/0508 29/745 |
| 2015/0295109 A1 | 10/2015 | Nobori | |
| 2015/0382482 A1* | 12/2015 | Hiyama | B23K 1/008 228/42 |
| 2016/0005599 A1* | 1/2016 | Lee | H01L 21/02565 136/262 |
| 2016/0105144 A1* | 4/2016 | Haynes | H01L 31/048 136/244 |
| 2017/0232705 A1* | 8/2017 | Nomura | B32B 5/26 442/268 |

FOREIGN PATENT DOCUMENTS

| | | |
|---|---|---|
| FR | 2996357 A1 | 4/2014 |
| WO | 2009090172 A2 | 7/2009 |

* cited by examiner

SYSTEM FOR TARGETED ANNEALING OF PV CELLS

CROSS-REFERENCES TO RELATED APPLICATIONS

This application claims the benefit of priority under 35 U.S.C. § 119(e) to U.S. Provisional Patent Application No. 62/267,220, entitled "SYSTEMS, METHODS AND APPARATUS FOR TARGETED ANNEALING OF PV CELLS," filed Dec. 14, 2015, the disclosure of which is incorporated herein by reference in its entirety for all purposes.

FIELD OF THE INVENTION

This disclosure relates to solar panel fabrication.

Definitions

A "solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A solar cell may be divided into a number of strips. A strip may have any shape and any size. The width and length of a strip may be the same or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a string.

"Finger lines," "finger electrodes," and "fingers" refer to elongated, conductive (e.g., metallic) electrodes of a photovoltaic structure for collecting carriers.

A "busbar," "bus line," or "bus electrode" refers to an elongated, conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND

Advances in photovoltaic technology, which are used to make solar panels, have helped solar energy gain mass appeal among those wishing to reduce their carbon footprint and decrease their monthly energy costs. However, the panels are typically fabricated manually, which is a time-consuming and error-prone process that makes it costly to mass-produce reliable solar panels.

Solar panels typically include one or more strings of complete solar cells. Adjacent solar cells in a string may overlap one another in a cascading arrangement. For example, continuous strings of solar cells that form a solar panel are described in U.S. patent application Ser. No. 14/510,008, filed Oct. 8, 2014, and entitled "Module Fabrication of Solar Cells with Low Resistivity Electrodes," the disclosure of which is incorporated herein by reference in its entirety. Producing solar panels with a cascaded cell arrangement can reduce the resistance due to inter-connections between the strips, and can increase the number of solar cells that can fit into a solar panel.

One method of making such a panel includes sequentially connecting the busbars of adjacent cells and combining them. One type of panel (as described in the above-noted patent application) includes a series of cascaded strips created by dividing complete solar cells into strips, and then cascading the strips to form one or more strings.

Precise and consistent division of solar cells into strips and alignment of strips or cells when forming a cascade arrangement is critical to ensure proper electrical and physical connections, but such alignment can be difficult to reliably achieve in high volumes if performed manually. Moreover, some systems for aligning and/or bonding the strips require applying direct pressure and heat to large portions of the strips using moving parts, which can cause damage to the strips or cells and require increased maintenance and decreased accuracy due to the increased number of moving parts involved.

SUMMARY

A targeted-annealing system is provided that can automatically cure conductive paste to bind overlapping strips of photovoltaic structures along their busbars without significantly damaging the photovoltaic structures. The targeted-annealing system can operate within an automated assembly line that can manufacture complete solar panels that may include multiple strings of cascaded strips.

The targeted-annealing system can process strings of cascaded strips on a supporting surface, and in some embodiments, can anneal the conductive paste between overlapping strips by blowing heated air on the overlapping sections of the strips. Later stages of the solar-panel assembly line may combine multiple of these strings to produce a solar panel.

The targeted-annealing system may avoid causing significant damage to a photovoltaic structure that may occur from bonding two strips using an electrically conductive material. The unique design of the targeted-annealing system can allow targeted application of heat to only the areas of the string that need to be cured. Additionally, the targeted-annealing system can apply heat to these areas without physically touching or otherwise applying increased forces on the surfaces that might damage the photovoltaic structure. Furthermore, the targeted-annealing system can calibrate the temperature of the heated air, the distance from which the heated air may be applied to the surface of the photovoltaic structures, and the amount of time that the heated air may be applied to the surface of the photovoltaic structures to achieve an optimum level of curing.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

Figure 1:
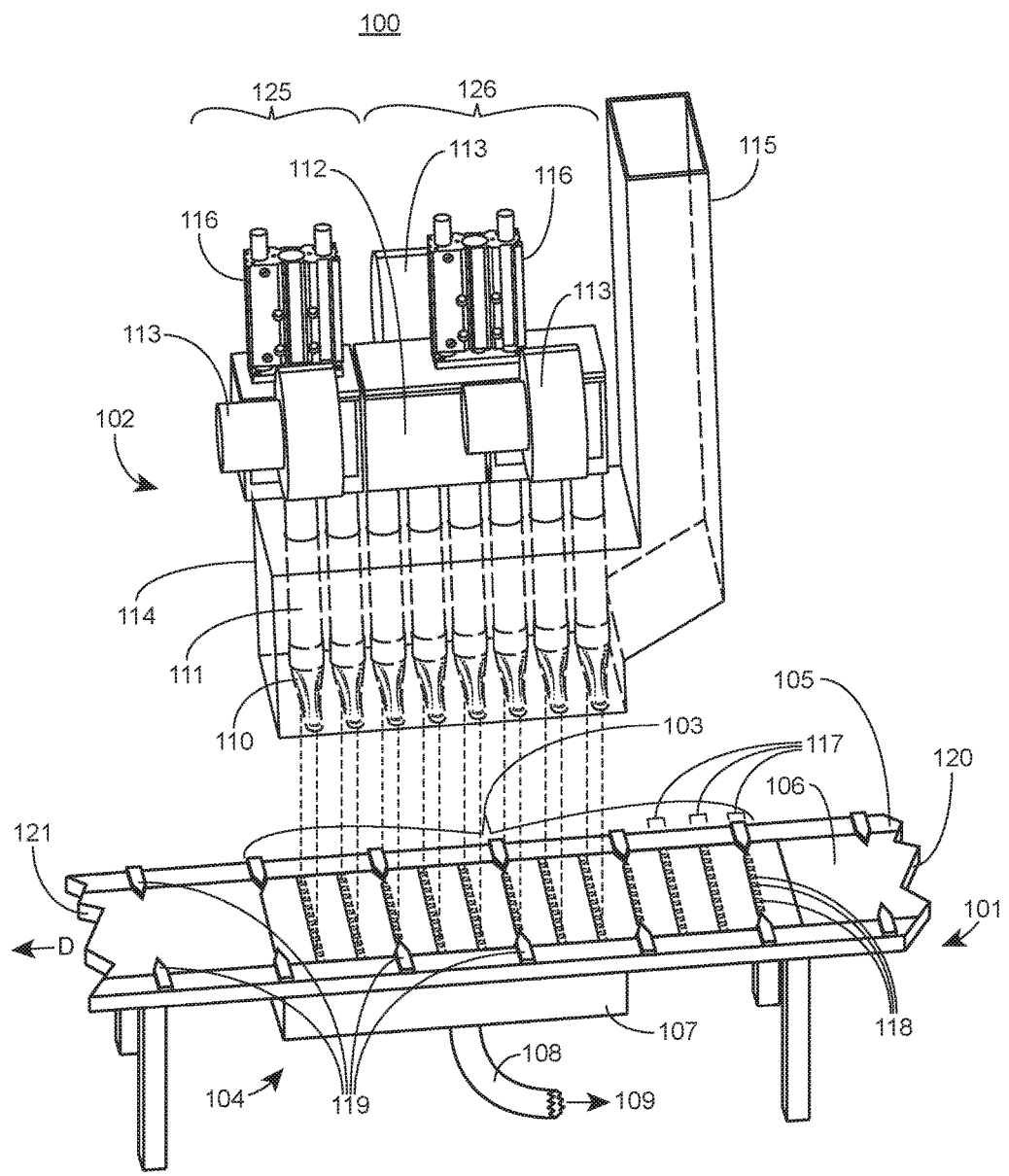
FIG. 1 shows a perspective view of a targeted-annealing system, according to one embodiment.

FIG. 1 shows targeted-annealing system 100, according to one embodiment. Targeted-annealing system 100 can include air supply system 102, supporting surface 101 disposed below air supply system 102 for supporting a string of cascaded PV strips 103, and vacuum system 104 coupled to supporting surface 101. As will be described in further detail below, targeted-annealing system 100 may apply heated air to overlapping sections of cascaded PV strips to cure conductive paste disposed between cascaded strips so as to bond the cascaded strips together.

Figure 2:
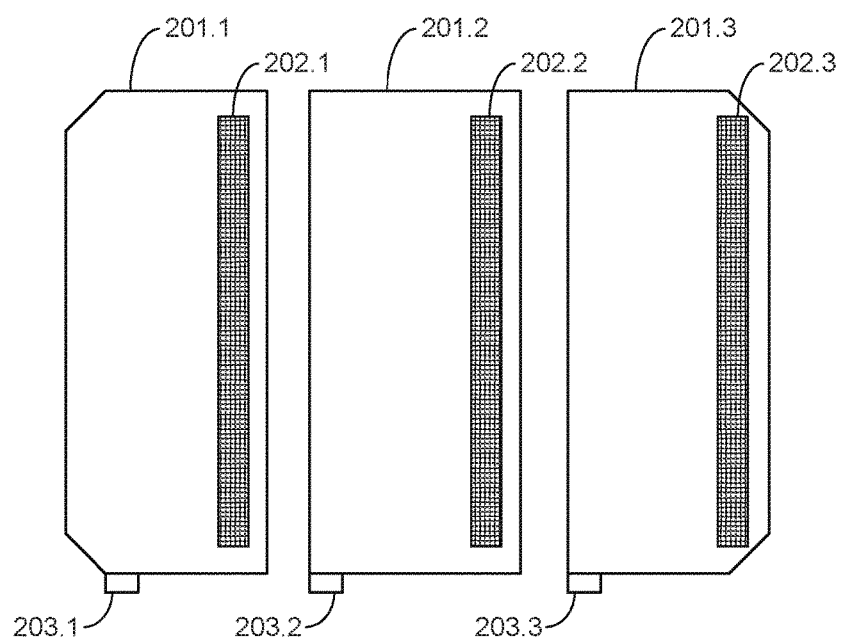
FIG. 2 shows three photovoltaic strips, according to one embodiment.

FIG. 2 shows three photovoltaic strips 201.1, 201.2, and 201.3, according to one embodiment. Each strip can include a conductive grid with a number of substantially parallel fingers (not shown). These fingers can collect the carriers generated by the photovoltaic structure and allow them to move toward a busbar (such as busbars 202.1, 202.2, and 202.3). The busbar can be any electrically conductive element such as a metallic strip; the busbar is often wider than a finger line, and is shown in FIG. 2 arranged in the Y direction. The busbar then can aggregate the current collected by the finger lines.

In some embodiments, each strip has backside fingers that may correspond to the front side fingers. As a result, the backside of the strips can also absorb light to generate electrical energy, thereby allowing the solar panel to operate in a bifacial manner. In some embodiments, the front and back side fingers can have similar patterns except that the front and back edge-busbars are located near opposite edges of the strip. In other words, the busbar on the front side of the strip may be located near one edge, and the busbar on the backside may be located near the opposite edge. For example, strip 201.1 can have busbar 202.1 on the top surface, and busbar 203.1 on the bottom surface. Similarly, strip 201.2 can have busbars 202.2 and 203.2 on the top and bottom surfaces, respectively, and strip 201.3 can have busbars 202.3 and 203.3 on the top and bottom surfaces, respectively. Additional busbars may be added to either surface to reduce resistance. In general, a respective surface of a strip can have various types of patterns. For example, a surface can have two, instead of one, busbars, or a single busbar placed in the center of the surface. In the example shown in FIG. 2, each surface can have a single busbar pattern placed on the edge, which allows the strips to be cascaded, as will be described below.

Figure 3:
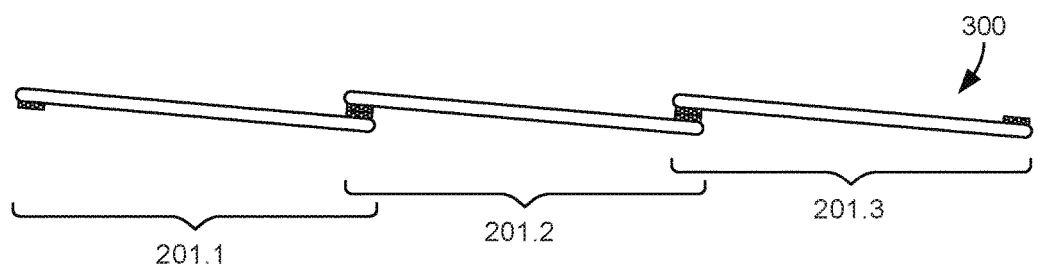
FIG. 3 shows a cascaded arrangement of three photovoltaic strips, according to one embodiment.

FIG. 3 shows cascaded arrangement 300 of three strips, according to one embodiment. In this example, three strips 201.1, 201.2, and 201.3 can be arranged in a cascaded manner, such that the positive-side busbar of one strip overlaps and is electrically coupled to the negative-side busbar of the neighboring strip. A conductive paste can be applied between two facing busbars to facilitate both low-resistance contact and physical bonding. Because no conductive tabs or wires are used, such a cascading arrangement can reduce the series resistance due to inter-connection between two strips, and can improve the fill-factor of the panel.

Targeted annealing of cascaded strips, such as those described with respect to FIG. 3 above, will now be described with reference to targeted annealing system 100 depicted in FIGS. 1, 4A, and 4B. As described above, targeted-annealing system 100 may include supporting surface 101 disposed below air supply system 102 for supporting a string of cascaded PV strips 103, and vacuum system 104 coupled to supporting surface 101. Supporting surface 101 may include porous supporting insert 106 that directly supports cascaded strips 103 and support frame 105 that supports porous supporting insert 106. Porous supporting insert 106 may be made of a porous material, such as a porous ceramic material, so as to allow vacuum system 104 to pull on cascaded strips 103 to maintain their position while being annealed by targeted annealing system 100. It will be understood to one skilled in the art that the porous material may include any suitable porous material, including porous ceramics, porous plastics, porous foams, and drilled substrates, that do not act as heat sinks to draw heat away from the overlaps of cascaded strips. It will be understood that using such materials that do not act as heat sinks, in contrast to conventional supporting surfaces, may allow the overlap to be more efficiently and uniformly heated, thus reducing the time necessary to cure the conductive paste and improving the overall bonding of the overlapping strips. As shown in FIG. 1, vacuum system 104 may include duct 107, which may be coupled to vacuum source 109 (not depicted) via coupling 108, so that vacuum system 104 may pull on cascaded strips 103 through porous supporting insert 106. It will be understood by one skilled in the art that any conventional vacuum system may be utilized, including any suitable vacuum source and/or components thereof.

As shown in FIG. 1, supporting surface 101 may receive cascaded strips 103 with overlapping sections 117. Overlapping sections 117 may include conductive paste 118 applied in between overlapping strips as described above. In some embodiments, conductive paste 118 may be applied as a series of drops along the busbars of each adjacent strip. Cascaded strips 103 may be received at end 120 from a previous processing step of the PV strips and may proceed in direction D towards end 121. For example, cascaded strips 103 may be received from one or more processing stations that apply conductive paste 118 to the strips, and arrange them in cascaded order as shown in FIG. 3.

In some embodiments, once cascaded strips 103 are received, supporting surface 101 may be configured to move cascaded strips 103 in direction D from end 120 to an annealing position between end 120 and end 121. Although not shown in detail in FIG. 1, supporting surface 101 may have a platform actuator including a conveyor system that allows it to move cascaded strips 103 as described. Supporting surface 101 may also include aligning features 119 which may be shaped and sized according to a corner formed between adjacent strips. For example, as shown in FIG. 1, aligning features 119 may have a triangular shape corresponding to a corner formed between two chamfered edges that meet at every third overlapping section (for example, if a series of strips 201.1, 201.2, and 201.3 were repeatedly cascaded so that a first strip 201.3 and a second set of strips starting with a second 201.1 overlapped). Aligning features 119 may keep strips 103 properly aligned on porous supporting insert 106 and may also aid in aligning overlapping sections 117 with air supply system 102. As shown in FIG. 1, which depicts strips 103 in the annealing position, strips 103 may be disposed below air supply system 102 so that heated air may be applied to overlaps 117 to cure conductive paste 118 and bond strips 103 together.

Air supply system 102 may include air blowers 113 coupled to and configured to supply air to air plenums 112. Air plenums 112 may in turn supply air to air heaters 111, which may heat the air received from air blowers 113 via air plenums 112 and output the air to overlaps 117 via air nozzles 110 coupled to air heaters 111. It will be understood that any suitable air heaters may be used to heat the air received from air blowers. The capacity of the air heaters may depend on the desired temperature and airflow rate. In some embodiments, each air heater 111 may have a 2000 kW capacity to achieve the desired temperature and flow rate to bond cascaded strips 103 together. As can be seen in FIG. 1, air nozzles 110 may be spaced apart at particular distances that correspond to distances between successive overlapping sections 117 of cascaded strips 103, so that successive air nozzles 110 may be aligned to successive overlapping sections 117.

Air heaters 111 and air nozzles 110 may be disposed within duct 114 which may be coupled to exhaust duct 115. Exhaust duct 115 may remove exhausted air from air supply system 102 as desired and necessary. In some embodiments, air nozzles 110, air heaters 111, air plenums 112, and air blowers 113 may be coupled to actuators 116 that adjust the position of the aforementioned components so that air nozzles 110 are a desired distance from cascaded strips 103. Actuators 116 may include guided cylinders as depicted in FIG. 1 that allow an assembly including air blowers 113, air plenums 112, air heaters 111, and air nozzles 110 to translate upwards and downwards between a standby position and an air application position while remaining laterally aligned as will be described below with respect to FIGS. 4A and 4B.

In the example shown in FIG. 1, three air blowers 113 may each supply air to separate air plenums 112. Air plenum 112 shown on the left of FIG. 1 may supply air to two air heaters 111, each of which is coupled to air nozzles 110. Air plenums 112 shown in the center and on the right of FIG. 1 may each supply air to three air heaters 111. In the example depicted in FIG. 1, one actuator 116 is coupled to left air blower 113, left air plenum 112, two corresponding air heaters 111, and two corresponding air nozzles 110 on the left of FIG. 1, and another actuator 116 is coupled to center and right air blowers 113, center and right air plenums 112, six corresponding air heaters 111, and six corresponding air nozzles 110 on the right of FIG. 1. Accordingly, in the example of FIG. 1, two air supply stations 125 and 126 may be provided that move independently of one another to separately apply heated air to a plurality of overlapping sections 117 of cascaded strips 103. It will be understood that air supply system 102 may include any number of air supply stations with any desirable configuration, including individually-actuated air supply stations for each overlapping section 117 or a single air supply station that simultaneously applies heated air to all overlapping sections 117 of strips 103.

As described above, in some embodiments, each air supply station may be actuated to translate from a standby position located a particular distance away from cascaded strips 103 to an air application position located at a particular distance closer than the standby position to allow the heated air to cure the conductive paste to bond the strips together. FIGS. 4A and 4B show a side view of the air supply station in the air application position and standby position respectively. As seen in FIG. 4A, when in the air application position, air supply station including air nozzle 110 and air heater 111 is lowered (by actuators such as actuators 116 depicted in FIG. 1) within duct 114 so that it approaches cascaded strips 103 (not shown in FIG. 4A) which sit on porous support insert 106 of support surface 101. In some embodiments, air supply system 102 may include sliding shutters 122 coupled to a lower portion of duct 114 and configured to open and close duct 114 as desired. As shown in FIG. 4A, shutters 122 may be automatically moved to an open position when air nozzle 110 is in the air application position. In this position, air nozzle 110 can apply heated air directly to the surface of cascaded strips 103 at overlapping section(s) 117 for a predetermined amount of time to allow conductive paste 118 to cure. In this way, cascaded strips 103 may be mechanically and electrically bonded together.

Figure 4A:
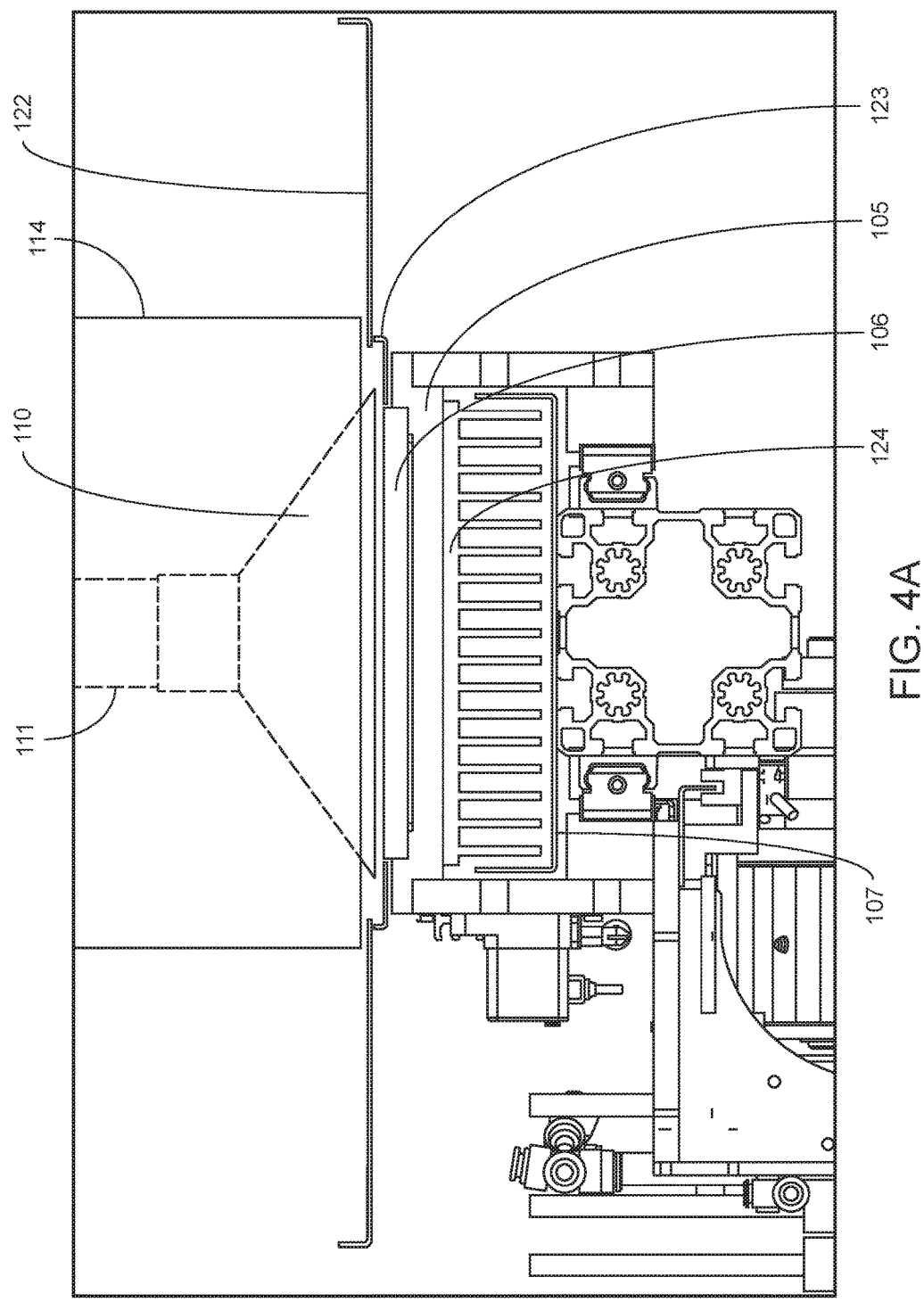
FIG. 4A shows a cross-sectional view of the targeted-annealing system of FIG. 1 with air supply system in an air application position, according to one embodiment.

In some embodiments, as shown in FIG. 4A, support surface 101 may include heat shield 123 which keeps heated air from escaping duct 114 while it is applied to cure conductive paste 118. It will be understood that heat shield 123 may both increase the efficiency of air supply system 102 and provide increased safety for users. In some embodiments, support surface 101 may include heat sink 124 coupled to support frame 106. Heat sink 124 may be configured to absorb heat resulting from application of heated air to overlapping section 117, so that other (i.e. non-overlapping) portions of strips 103 do not become unnecessarily heated. It will be understood that heat sink 124 may aid in avoiding damage to strips 103.

Figure 4B:
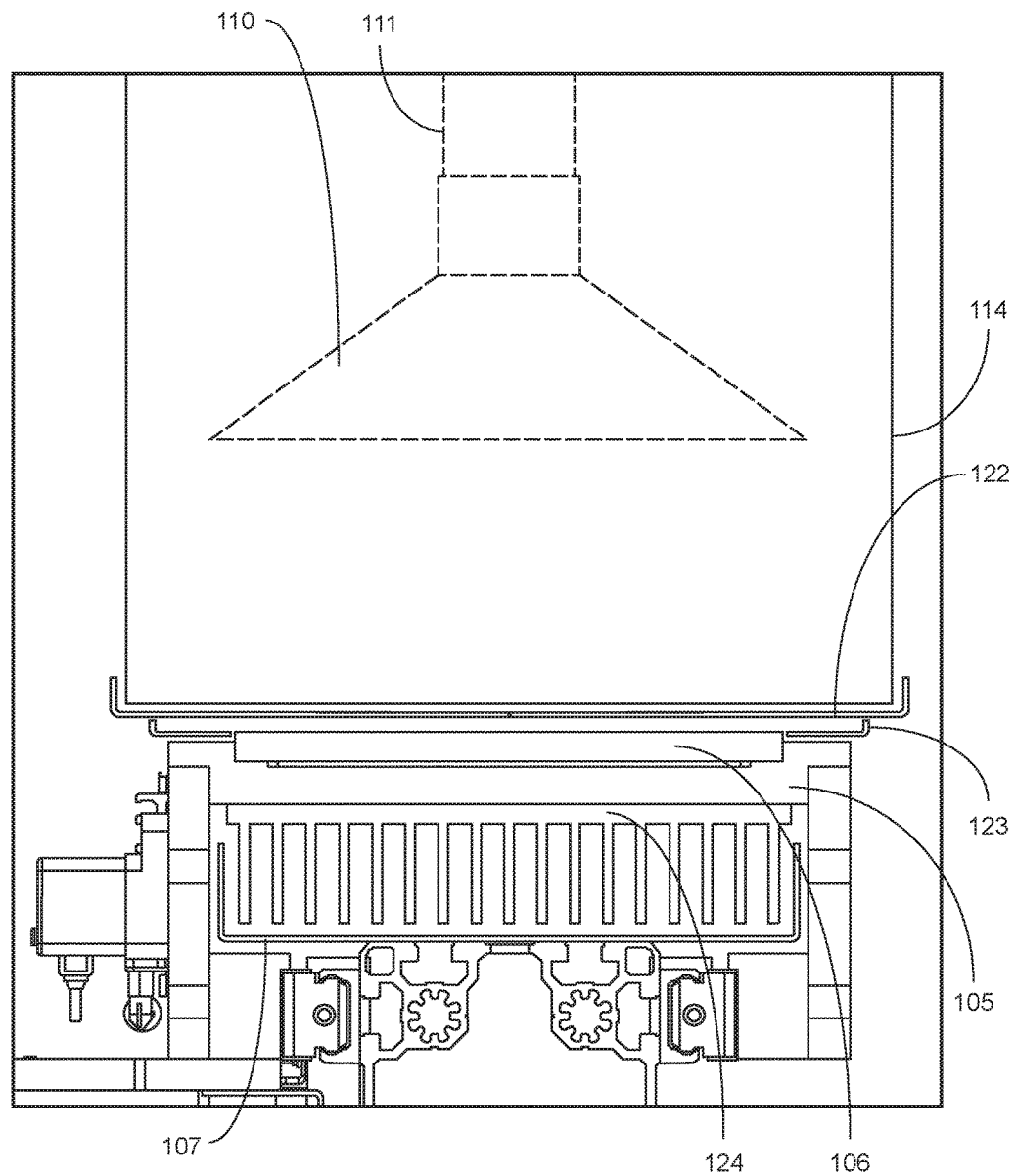
FIG. 4B shows a cross-sectional view of the targeted-annealing system of FIG. 1 with air supply system in a standby position, according to one embodiment.

In FIG. 4B, air supply station including air nozzle 110 and air heater 111 is shown in a standby position, raised (for example, by actuators 116 depicted in FIG. 1) within duct 114 a particular distance away from porous support insert 106. As shown in FIG. 4B, when air supply station is in a standby position, shutters 122 may automatically be moved to a closed position, ensuring that air does not escape from duct 114. In some embodiments, the arrangement shown in FIGS. 4A and 4B may allow for air heaters 111 and air blowers 113 to remain in operation even when not applying heated air to overlaps 117 without causing unnecessary exposure to other portions of cascaded strips 103 or users. It will be understood that this may avoid inefficiencies associated with increased cycling on and off of air heaters 111 and/or air blowers 113.

Figure 5:
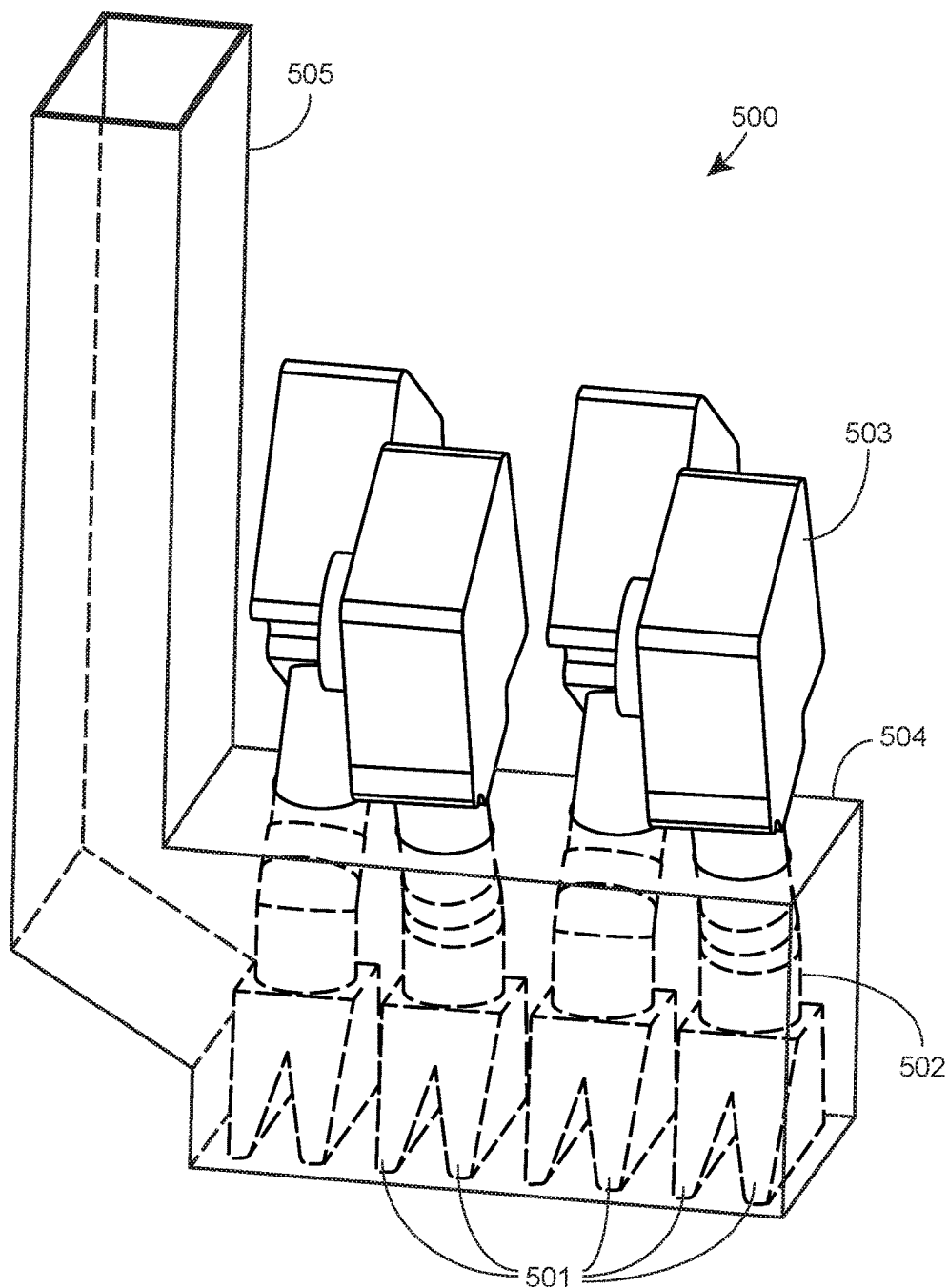
FIG. 5 shows an alternative air supply system for a targeted-annealing system, according to one embodiment.
Figure 6:
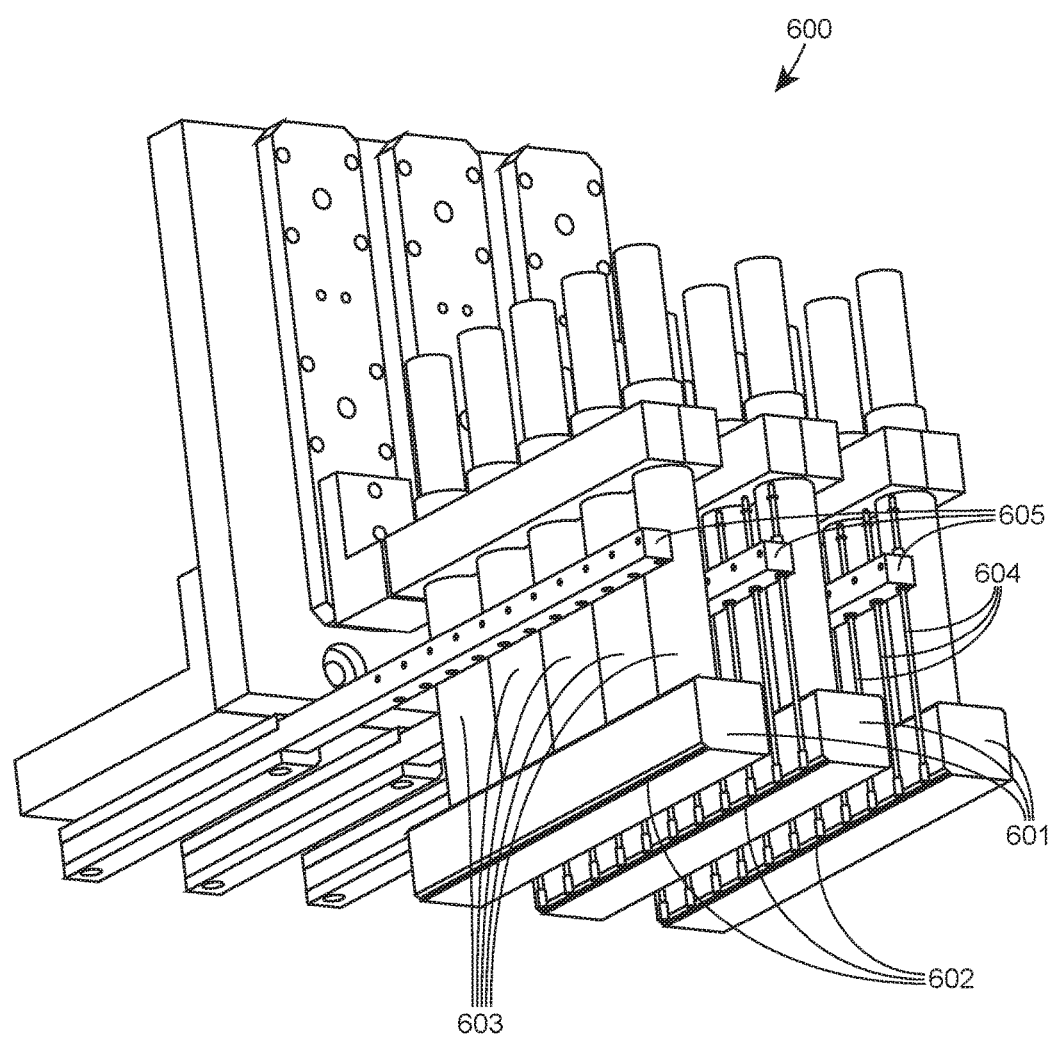
FIG. 6 shows an alternative air supply system for a targeted-annealing system, according to one embodiment.

FIGS. 5 and 6 show alternative air supply systems 500 and 600 for a targeted-annealing system, according to embodiments. Specifically, with reference to FIG. 5, air supply system 500 may include split air nozzles 501 coupled to air heaters 502, which are in turn coupled to air blowers 503. As can be seen in FIG. 5, air heaters 502 and split air nozzles 501 are disposed in duct 504 which is coupled to exhaust vent 505, similar to duct 114 and exhaust duct 115 described with respect to FIG. 1 above. Split air nozzles 501 may be configured to separate the heated air received from each air heater 502 to be output from two spaced apart locations. Split air nozzles 501 may be designed so that the distance between the two spaced apart locations corresponds to the distance between successive overlapping sections (for example overlapping sections 117 described above) of cascaded strips to which nozzles 501 apply heated air. Accordingly, each split air nozzle 501 may apply heated air to two successive overlapping sections of cascaded strips, and in the example shown in FIG. 5, split air nozzles 501 may simultaneously cure eight successive overlapping sections. It will be understood that the example shown in FIG. 5 is only illustrative and not limiting, and any number of singular and/or split air nozzles may be provided to cure any desired number of overlapping sections of cascaded strips. Moreover, split air nozzles may also be designed to separate heated air to be output from more than two spaced apart locations.

With reference to FIG. 6, air supply 600 includes air nozzles 601 coupled to air heaters 603. Although not shown in FIG. 6, air heaters 603 may receive air from air blowers such as those described above. Each air nozzle 601 may receive heated air from a series of air heaters 603, and output the heated air via slot 602. As can be seen in FIG. 6, slots 602 may be rectangular-shaped slots that correspond to the geometry of overlapping sections of cascaded strips (for example overlapping sections 117 described above) so that heated air may be uniformly supplied to the entirety of each overlapping section. It will be understood that slots 602 may be designed to have any desirable shape corresponding to the geometry of overlapping sections of cascaded strips or otherwise corresponding to the arrangement of conductive paste disposed between the overlapping cascaded strips to allow heated air to uniformly cure the conductive paste. For example, instead of slots, a number of holes corresponding to drops of conductive paste may be provided in air nozzles. In some embodiments, each set of air nozzles 601 and corresponding air heaters 603 may be coupled to an actuator or other mechanism (not shown) which allows each set of air nozzles 601 and air heaters 603 to translate towards and away from cascaded strips as described above with respect to FIGS. 4A and 4B. Air supply 600 may include a set of guided cylinders 604 that translate through bores within supports 605 in order to keep air nozzles 601 aligned during translation towards cascaded strips. In some embodiments, all air nozzles 601 may be coupled to a single actuator that simultaneously translates each air nozzle 601 toward and away from overlapping sections of cascaded strips.

Figure 7:
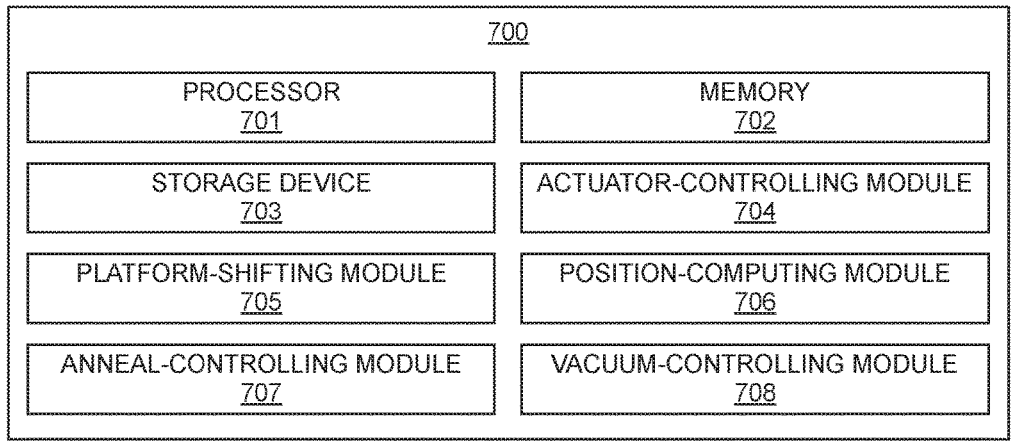
FIG. 7 shows an exemplary control apparatus, according to one embodiment.

FIG. 7 shows exemplary control apparatus 700, according to one embodiment.

Apparatus 700 can include a plurality of modules that may communicate with one another via a wired or wireless communication channel. Apparatus 700 may be realized using one or more integrated circuits, and may include fewer or more modules than those shown in FIG. 7. Further, apparatus 700 may be integrated in a computer system, or realized as a separate mechanism that may be capable of communicating with other computer systems and/or mechanisms.

Control apparatus 700 can include processor 701, memory 702, and storage device 703. Memory 702 can include a volatile memory (e.g., RAM) that serves as a managed memory, and can be used to store one or more memory pools. In some embodiments, storage device 703 can store an operating system, and instructions for monitoring and controlling the string-annealing process. Storage device 703 represents non-transitory computer-readable storage media that can store program code and/or data that provide the functionality of embodiments of the present disclosure. In some embodiments, memory 702 can include a number of memories including main random access memory (RAM) for storage of instructions and data during program execution and/or read-only memory (ROM) in which fixed instructions may be stored. Storage device 703 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art. In an aspect, a module as described herein may be or may include software or firmware stored in memory 702 and/or storage device 703. In another aspect, a module may comprise special-purpose hardware operating computer instructions to accomplish the tasks as set forth herein.

For example, as illustrated, apparatus 700 also includes actuator-controlling module 704, platform-shifting module 705, position-computing module 706, and anneal-controlling module 707. Actuator-controlling module 704 can activate a set of actuators of a targeted-annealing system to conform a set of air nozzles to a predetermined elevation, such as to lower or raise a set of air nozzles toward or away from a string on an annealing platform as described above with respect to FIGS. 4A and 4B. Actuator-controlling module 704 may also activate a set of actuators of a targeted-annealing system to open or close shutters as described above with respect to FIGS. 4A and 4B. Platform-shifting module 705 can activate a set of actuators that can cause the annealing platform to align the overlapping strip segments of a string to air nozzles prior to each annealing step, and to move the string toward a lay-up station after the annealing process. The layup table can combine multiple strings to form a solar panel.

Position-computing module 706 can periodically re-compute an updated position of the cascaded string on the annealing platform, while the annealing platform moves the string toward the targeted-annealing system or toward the lay-up station. For example, position-computing module 706 can determine the position of the annealing platform and a timestamp for each position by reading a set of sensors (e.g., proximity sensors, such as radio frequency identification sensors, optical sensors, or the like) lined along a platform base. Each sensor can correspond to a different absolute position of the platform base with respect to the platform base, and position-computing module 706 can compute an updated position of the annealing platform between sensors based on a timestamp, speed, and direction in which the annealing platform is moving. Anneal-controlling module 707 can conform a set of air nozzles with the overlapping strip segments to anneal the conductive paste through a sequence of one or more annealing steps as the annealing platform shifts the string toward the lay-up station.

It should be further noted that, in various embodiments, two or more of the modules described herein may be combined as one logical or physical module; one or more module may be split into multiple logical or physical modules; and modules may further have differing instructions to accomplish the functions described herein. Based on the disclosure and teachings provided herein, a person of ordinary skill in the art will appreciate other ways and/or methods to implement the various embodiments. However, computer-readable storage media does not include transitory media such as carrier waves or the like.

Figure 8:
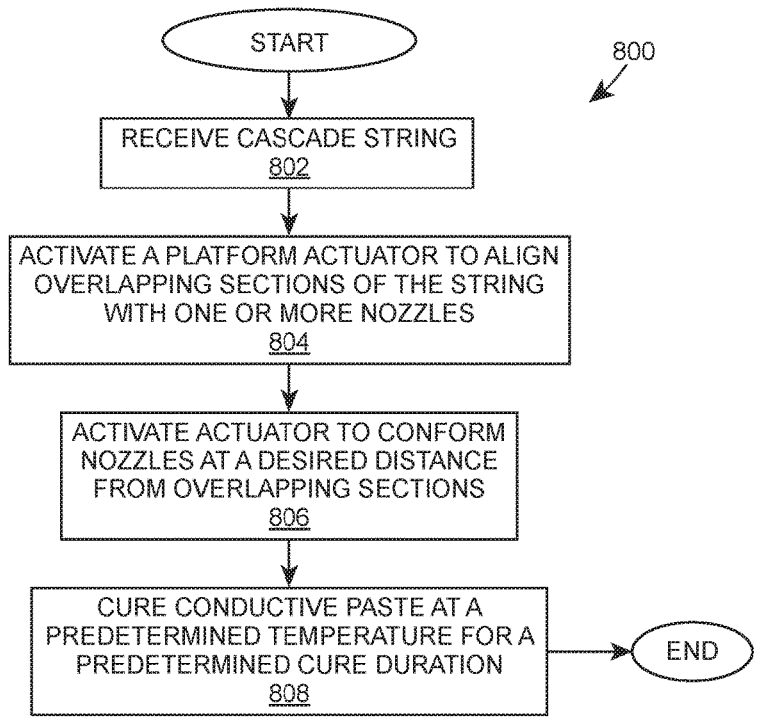
FIG. 8 shows a flow chart showing a method for curing a conductive paste between overlapping strips, according to one embodiment.

FIG. 8 presents a flow chart showing method 800 for curing a conductive paste between overlapping strips, according to one embodiment of the invention. During operation, a controller can control a platform to receive a string of cascaded strips (operation 802). The controller can then move the string to a targeted-annealing station by activating a platform actuator to align overlapping strip segments with one or more air nozzles (operation 804). Once the string's overlapping sections become aligned with the air nozzles, the controller can activate one or more actuators that can conform a set of air nozzles (operation 806), such as by moving a set of shutters covering a duct opening to an open position and lowering the set of air nozzles in the duct to a position that is a desired distance from the overlapping strip segments.

The controller may then cure the conductive paste at a predetermined temperature for a predetermined cure duration (operation 808). In some embodiments, the controller may regulate a respective air supply system providing air to the air nozzles to maintain a target curing temperature and flow rate of the air output by the air nozzles. In some embodiments, the target curing temperature can be 160 degrees Celsius. In some embodiments, the predetermined cure duration may be 10 seconds or less. In some aspects, the controller may monitor sensors to dynamically determine temperature, cure duration, and/or other aspects of the process.

After curing the conductive paste, the controller may activate the actuator to move the air nozzles away from the top string surface and may move the shutters to a closed position covering an opening in a duct surrounding the air nozzles. For example, the actuator can move the set of air nozzles to a standby position above the annealing platform as described with respect to FIG. 4B above. The controller may then activate the platform actuator to move the string forward and align additional overlaps with air nozzles and repeat steps 804-808 above until all of the overlaps are cured.

The system and various devices may also include one or more software applications, modules, services, or other elements located within at least one working memory device, including an operating system and application programs, such as a client application or browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. Further, various descriptions of features in "one embodiment" or "an embodiment" are merely intended to indicate that a feature may occur in any, but not necessarily all embodiments; features may be combined in various ways as understood within the description as a whole. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Any of the methods described herein may be totally or partially performed with a computer system including one or more processors, which can be configured to perform the steps. Thus, embodiments can be directed to computer systems configured to perform the steps of any of the methods described herein, potentially with different components performing a respective steps or a respective group of steps. Although presented as numbered steps, steps of methods herein can be performed at a same time or in a different order. Additionally, portions of these steps may be used with portions of other steps from other methods. Also, all or portions of a step may be optional. Additionally, any of the steps of any of the methods can be performed with modules, circuits, or other means for performing these steps.

What is claimed is:

1. A targeted-annealing system comprising:
at least one air supply system comprising two air nozzles;
at least one air heater coupled to the two air nozzles;
at least one air blower coupled to the at least one air heater;
wherein the at least one air blower is configured to provide air to the at least one air heater, the at least one air heater is configured to heat the air to a predetermined temperature and provide the air to the two air nozzles, wherein the at least one air supply system is configured to output heated air to a desired temperature via the two air nozzles; and
a supporting surface disposed below the two air nozzles and configured to support three cascaded photovoltaic (PV) strips, comprising a first strip, a second strip, and a third strip, wherein the three cascaded photovoltaic strips further comprise a first busbar on a top surface of the first strip and extending across a width of the first strip overlaps with a second busbar on a bottom surface of the second busbar and extending across a width of the second strip defining a first overlap, and a third busbar on a top surface of the second strip and extending across the width of the second strip overlaps with a fourth busbar on a bottom surface of the third strip and extending across a width of the third strip defining a second overlap, wherein conductive paste is disposed in the first and second overlaps, wherein each of the two air nozzles comprise an elongated slot of a complementary size and shape to the first and second overlaps and configured to be oriented in directions across the widths of the first and second strips, wherein the two air nozzles are configured to provide the heated air to the first and second overlaps via each of the elongated slots, and wherein the two air nozzles are configured to be spaced apart in order to be aligned with a respective one of the first and second overlaps and configured to provide the heated air output to heat the first and second overlaps such that the heated air output cures the conductive paste in the first and second overlaps to bond the three cascaded PV strips together.

2. The system of claim 1, further comprising a vacuum system coupled to the supporting surface configured to maintain a position of the cascaded PV strips relative to the supporting surface.

3. The system of claim 2, wherein the supporting surface comprises a porous ceramic material.

4. The system of claim 2, wherein the vacuum system comprises at least one duct coupled to at least one fan, wherein the vacuum system is configured to pull on the three cascaded PV strips through the supporting surface to maintain the position of the three cascaded PV strips.

5. The system of claim 1, wherein:
the at least one air supply comprises at least two air supplies, each air supply comprising at least one respective air nozzle of the two air nozzles.

6. The system of claim 1, further comprising an actuator coupled to the at least one air supply configured to move the two air nozzles to a desired height such that the two air nozzles are disposed at a predetermined distance from the first and second overlaps.

7. The system of claim 1, wherein the conductive paste is disposed as an adhesive between neighboring cascaded PV strips.

* * * * *